(12) United States Patent
Hwang et al.

(10) Patent No.: US 11,322,288 B2
(45) Date of Patent: May 3, 2022

(54) FLUID-COOLED ELECTROMAGNETS

(71) Applicant: Korea Research Institute of Standards and Science, Daejeon (KR)

(72) Inventors: Seong Min Hwang, Sejong-si (KR); Jeong Hyun Shim, Daejeon (KR); Ingo Hilschenz, Daejong (KR); Seong-Joo Lee, Daejeon (KR); Kiwoong Kim, Daejeon (KR)

(73) Assignee: Korea Research Institute of Standards and Science, Daejeon (KR)

( * ) Notice: Subject to any disclaimer, the term of this patent is extended or adjusted under 35 U.S.C. 154(b) by 442 days.

(21) Appl. No.: 16/574,591

(22) Filed: Sep. 18, 2019

(65) Prior Publication Data

US 2020/0152368 A1 May 14, 2020

(51) Int. Cl.
*H01F 27/28* (2006.01)
*H01F 27/10* (2006.01)
*G01R 33/34* (2006.01)

(52) U.S. Cl.
CPC .............. *H01F 27/10* (2013.01); *G01R 33/34* (2013.01); *H01F 27/2871* (2013.01)

(58) Field of Classification Search
CPC ............................. H01F 27/10; H01F 27/2871

USPC ........................................................ 335/55
See application file for complete search history.

(56) References Cited

U.S. PATENT DOCUMENTS

| 3,466,582 | A | * | 9/1969 | Sealey | H01F 37/00 336/60 |
| 3,548,354 | A | * | 12/1970 | Schwab | H01F 27/2876 336/57 |
| 3,755,644 | A | * | 8/1973 | Lewis | H05B 6/104 219/674 |
| 4,000,482 | A | * | 12/1976 | Staub | H01F 27/322 336/60 |
| 4,477,791 | A | * | 10/1984 | Thiel | H01F 27/322 336/60 |
| 2016/0247621 | A1 | * | 8/2016 | Ono | H01F 27/322 |

* cited by examiner

*Primary Examiner* — Alexander Talpalatski
*Assistant Examiner* — Joselito S. Baisa
(74) *Attorney, Agent, or Firm* — Andrew D. Fortney; Central California IP Group, P.C.

(57) ABSTRACT

A fluid-cooled electromagnet includes an upper housing, a lower housing vertically aligned with the upper housing, a plurality of pancake coils disposed between the upper housing and the lower housing to be spaced apart from each other and sequentially stacked to have a washer shape, and at least one spacer, disposed between the upper housing and the lower housing, accommodating the pancake coils at regular intervals.

8 Claims, 11 Drawing Sheets

FLUID-COOLED ELECTROMAGNETS

CROSS-REFERENCE TO RELATED APPLICATIONS

This U.S. non-provisional patent application claims priority under 35 U.S.C. § 119 to Korean Patent Application No. 10-2018-0137806, filed on Nov. 12, 2018, in the Korean Intellectual Property Office, the entire contents of which are hereby incorporated by reference.

TECHNICAL FIELD

The present disclosure relates to a electromagnets and, more particularly, to fluid-cooled electromagnets for generating a pre-polarization magnetic field to effectively generate and block a strong magnetic field.

BACKGROUND

Conventional pre-polarization magnetic field coils are classified into small solenoid-type air-cooled coils, liquid nitrogen-cooled coils, and water-cooled coils.

A small solenoid-type air-cooled coil is easily manufactured and widely used due to a simple structure thereof. However, the small solenoid-type air-cooled coil suffers from the disadvantages that a volume capable of applying a pre-polarization magnetic field is very small, generatable pre-polarization magnetic field is limited to about 10 milliteslas (mT), and long-term use of the small solenoid-type air-cooled coil is difficult due to the lack of an effective cooling method.

A liquid nitrogen cooled coil reduces its own temperature with liquid nitrogen having a boiling point of 77 K to reduce electrical resistance to about one-eighth (⅛) of room temperature and to promote fast and effective coil cooling from boiling of the liquid nitrogen. A Dewar for the coil is required to contain the cooling liquid nitrogen. It is costly to manufacture a Dewar due to its complexity and difficulty in manufacturing the Dewar. Since the Dewar represents a large proportion of weight and volume, the volume capable of applying a pre-polarization magnetic field is reduced correspondingly. Even with a high-performance Dewar, it is necessary to periodically fill the Dewar with cooling liquid nitrogen, which is inconvenient.

A water-cooled coil (including the case in which a cooling oil such as mineral oil, silicone oil or fluoride compound is used as a coolant) cools a coil with a typical coolant such as water, mineral oil or silicone oil used at room temperature. Since a difference between internal and external temperatures of an enclosure covering a coil is small and the enclosure has only to withstand an internal pressure required for circulation of a coolant, it is relatively easy to fabricate the enclosure. When the conducting wire of a coil is a Litz wire, it is necessary to form a space, through which the coolant can pass, in the coil. Accordingly, winding becomes complex and effective current density is reduced. When a copper pipe allowing the coolant to flow to a center thereof is used as the conducting wire of the coil, a circulation structure of the coolant is simplified and loss of the effective current density is reduced. However, the bulk of the conducting wire causes significant amount of thermal noise in which a cross section of the conducting wire is increased.

SUMMARY

An aspect of the present disclosure is to provide an fluid-cooled magnet which operates at room temperature and eliminate thermal noise to address issues of a conventional water-cooled magnet.

According to an aspect of the present disclosure, a fluid-cooled electromagnet includes an upper housing; a lower housing vertically aligned with the upper housing; a plurality of pancake coils disposed between the upper housing and the lower housing to be spaced apart from each other and sequentially stacked to have a washer shape; and at least one spacer, disposed between the upper housing and the lower housing, accommodating the pancake coils at regular intervals. The spacer includes: a washer-shaped external side spacer having a first upper groove to receive a portion of an external side surface of one pancake coil and a first lower groove to receive a portion of an external side surface of another pancake coil; an internal side spacer having a second upper groove to receive a portion of an internal side surface of one pancake coil and a second lower groove to receive a portion of an internal side surface of another pancake coil; and a fluid path blocking portion connecting the internal side spacer and the external side spacer in a radial direction and blocking washer-shaped coolant flowing spaces, respectively formed above and below the pancake coil. The external side spacer includes a first vertical coolant flowing space and a second vertical coolant flowing space, recessed on an internal side surface of the external side spacer, disposed to penetrate through the external side spacer, and respectively disposed in both sides of a connection portion of the flow path blocking portion. A coolant is introduced through the first vertical coolant flowing space and is discharged through the second vertical coolant flowing space after rotating once along the coolant flowing space.

In an example embodiment, the lower housing, the spacers, and the upper housing may be fixed to each other by an adhesive to be integrated.

In an example embodiment, the pancake coil may include a Litz wire wound in a spiral form, and the Litz wire may be molded by an adhesive filling material.

In an example embodiment, the internal side spacer may be recessed on an external side surface of the internal side spacer and may penetrate through the internal side spacer, and may include a vertical wiring connection space.

In an example embodiment, the fluid-cooled electromagnet may further include: an upper spacer disposed between the spacer and the upper housing; and a lower housing disposed between the spacer and the lower housing. The upper spacer may include: a washer-shaped external side upper spacer having a first lower groove to receive a portion of an external side surface of the pancake coil; an internal side upper spacer having a second lower groove to receive a portion of an internal side surface of the pancake coil; and a flow path blocking portion connecting the internal side upper spacer and the external side upper spacer in a radial direction and blocking washer-shaped coolant flowing spaces, respectively formed above and below the pancake coil. The external side upper spacer may include a first vertical coolant flowing space and a second vertical coolant flowing space recessed on an internal side surface of the external side upper spacer, disposed to penetrate through the external side upper spacer, and respectively disposed in both sides of a connection portion of the flow path blocking portion. The lower spacer may include: a washer-shaped external side lower spacer having a first upper groove to receive a portion of an external side surface of the pancake coil; an internal side lower spacer having a second upper groove to receive a portion of an internal side surface of the pancake coil; and a flow path blocking portion connecting the internal side lower spacer and the external side lower spacer in a radial direction and blocking washer-shaped coolant flowing spaces, respectively above and below the pancake coil. The external side lower spacer may include a first vertical coolant flowing space and a second vertical coolant flowing space recessed on an internal side surface of the external side lower spacer, disposed to penetrate through the external side lower spacer, and respectively disposed in both sides of a connection portion of the flow path blocking portion.

In an example embodiment, each of the pancake cools may be wound on the same plane in a spiral form, and the pancake coils may electrically connected to each other in series.

In an example embodiment, the fluid-cooled electromagnet may further include: a coolant inlet penetrating through a side surface of the external side lower spacer to be connected to the first vertical coolant flowing space; and a coolant outlet penetrating through a side surface of the external side upper spacer to be connected to the second vertical coolant flowing space.

In an example embodiment, the lower housing, the spacers, and the upper housing may be fixed to each other by a bolt and a nut to be sealed through an O-ring.

BRIEF DESCRIPTION OF THE DRAWINGS

The present disclosure will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

DETAILED DESCRIPTION

An ultra-low field nuclear magnetic resonance/magnetic resonance imaging (ULF-NMR/MRI) apparatus uses a superconducting quantum interference device (SQUID) which is capable of measuring a magnetic field of a few fT. In the ULF-NMR/MRI apparatus, a SQUID sensor senses a low-frequency nuclear magnetic resonance (NMR) signal. Although a strong pre-polarization magnetic field is required, there are a plurality of issues on generation of the strong pre-polarization magnetic field. An intensity of an NMR signal depends on the magnitude and duration of the pre-polarization magnetic field. The pre-polarization magnetic field requires the magnitude of 10 mT or more, a fast ramping-down time of 10 msec or less, and a negligible amount of residual magnetic field after ramping down.

The ULF-NMR/MRI system requires a pre-polarization coil (Bp coil) which may generate a strong pre-polarization magnetic field and may rapidly and completely remove the same pre-polarization magnetic field.

Since a pre-polarization magnetic field Bp should be removed rapidly and completely, the pre-polarization magnetic field requires characteristics, as follows. First, all materials, constituting a coil, should be free of magnetism. Second, eddy current should not current or a life of the eddy current should be shorter than a ramping-down time of the pre-polarization magnetic field Bp (10 ms or less) when the pre-polarization magnetic field Bp is generated or blocked. Third, thermal noise, occurring in a coil, should be low enough to have no influence on detection of a magnetic resonance signal. Fourth, since an induced electromotive force of hundreds to thousands of volts is generated when the pre-polarization magnetic field Bp is generated or is blocked, a coil generating the pre-polarization Bp should be designed to withstand the induced electromotive force. Fifth, since a large amount of current flows to a coil when the pre-polarization magnetic field Bp is generated, electrical resistance of the coil should be significantly reduced such that heating may be reduced. In addition, an effective coil cooling method is required to limit an increase in temperature of the coil caused by the generated heat.

Embodiments of the present disclosure will now be described below more fully with reference to accompanying drawings. The present disclosure may, however, be embodied in different forms and should not be constructed as limited to the embodiments set forth herein. Rather, these embodiments are provided so that this disclosure will be thorough and complete, and will fully convey the scope of the present invention to those skilled in the art.

Figure 1:
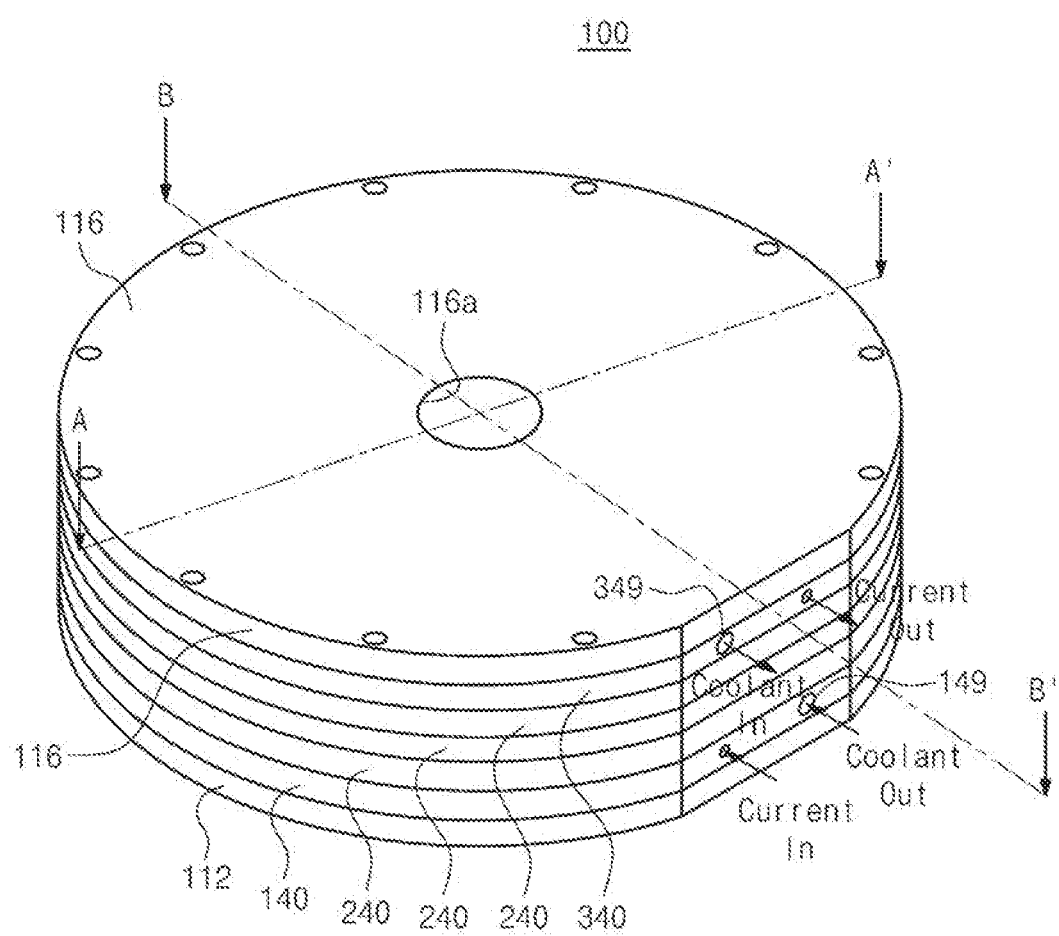
FIG. 1 is a perspective view of an electromagnet according to an example embodiment of the present disclosure.

FIG. 1 is a perspective view of an electromagnet according to an example embodiment of the present disclosure.

Figure 2:
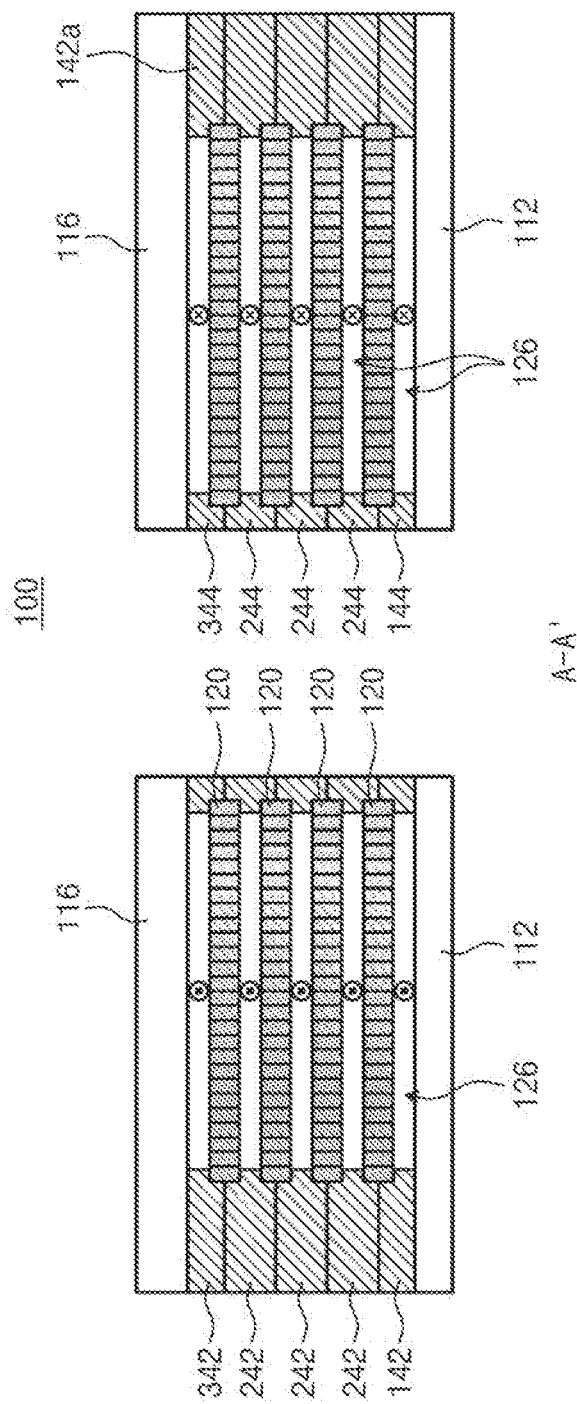
FIG. 2 is a cross-sectional view taken along line A-A' of the electromagnetic in FIG. 1.

FIG. 2 is a cross-sectional view taken along line A-A' of the electromagnetic in FIG. 1.

Figure 3:
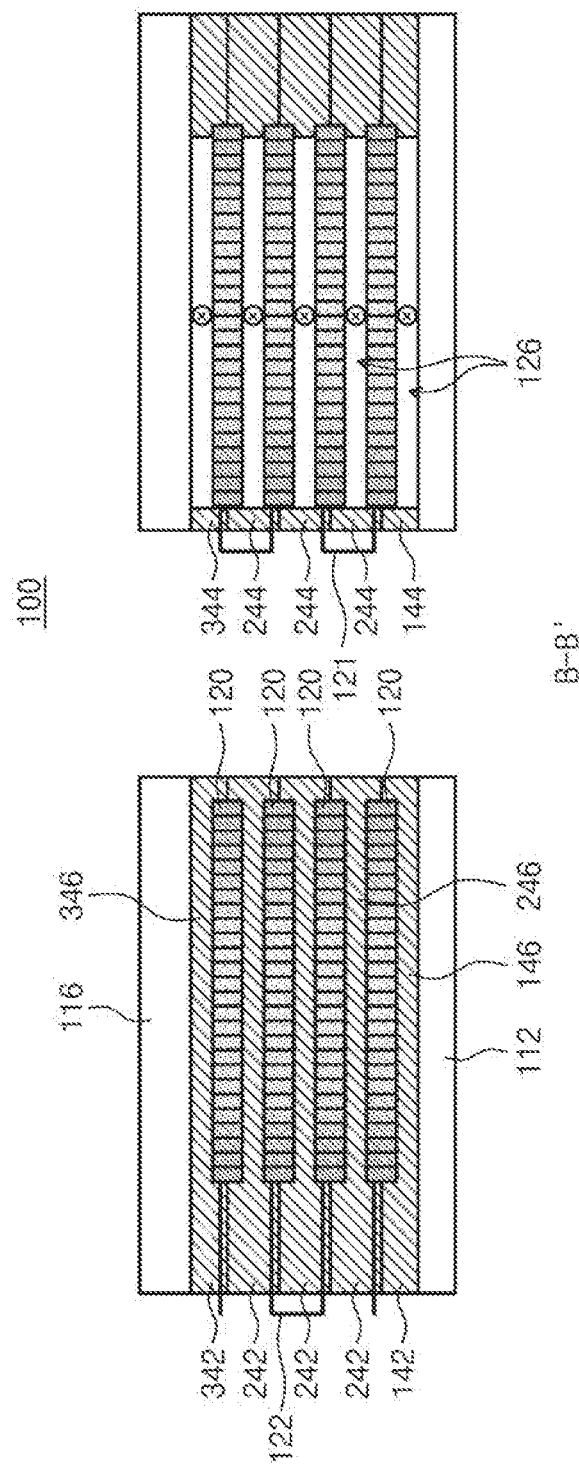
FIG. 3 is a cross-sectional view taken along line B-B' of the electromagnetic in FIG. 1.

FIG. 3 is a cross-sectional view taken along line B-B' of the electromagnetic in FIG. 1.

Figure 4:
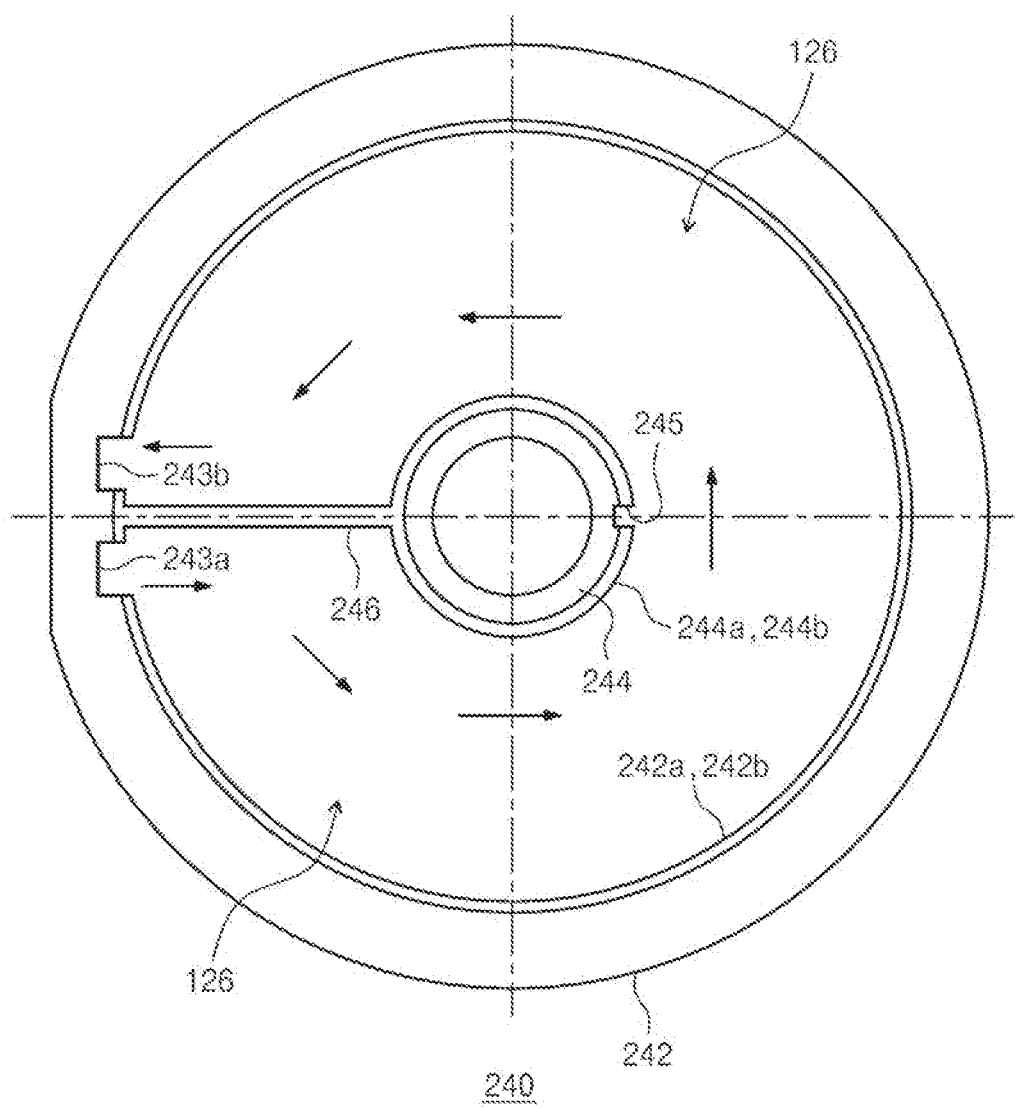
FIG. 4 is a top view of a spacer of the electromagnet in FIG. 1.

FIG. 4 is a top view of a spacer of the electromagnet in FIG. 1.

Figure 5:
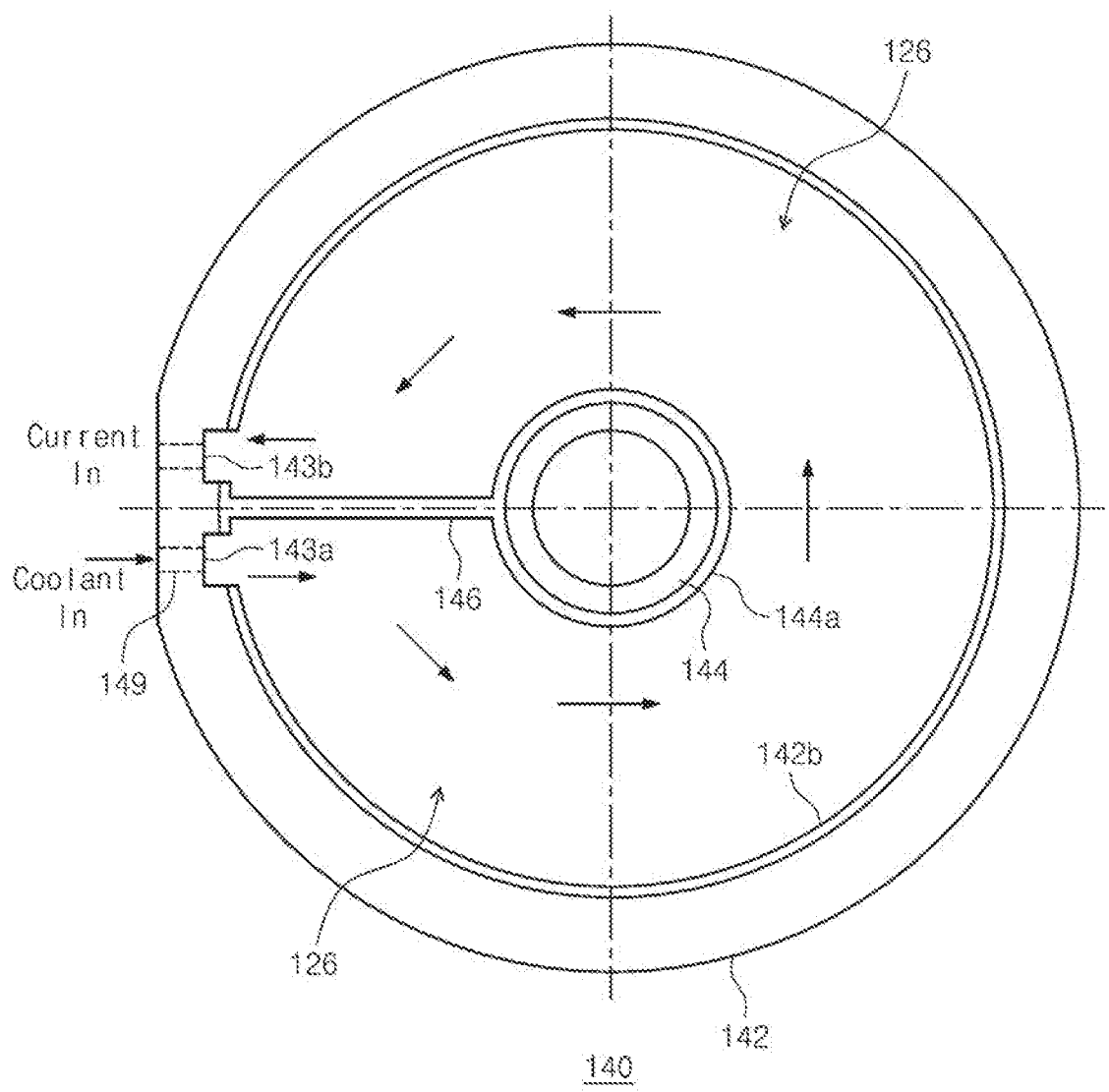
FIG. 5 is a plan view of a bottom spacer of the electromagnet in FIG. 1.

FIG. 5 is a plan view of a bottom spacer of the electromagnet in FIG. 1.

Figure 6:
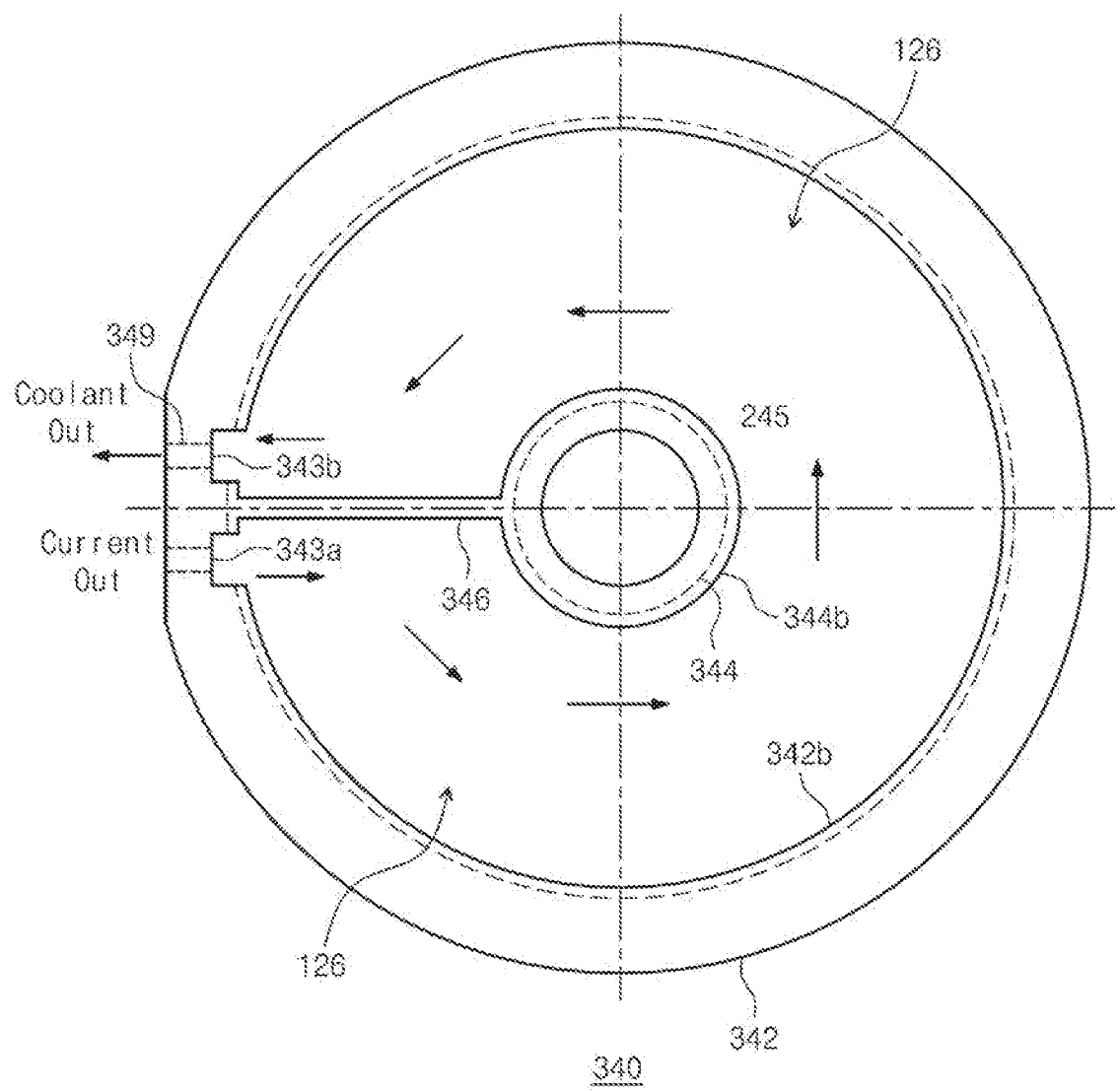
FIG. 6 is a plan view of a top spacer of the electromagnet in FIG. 1.

FIG. 6 is a plan view of a top spacer of the electromagnet in FIG. 1.

Figure 7:
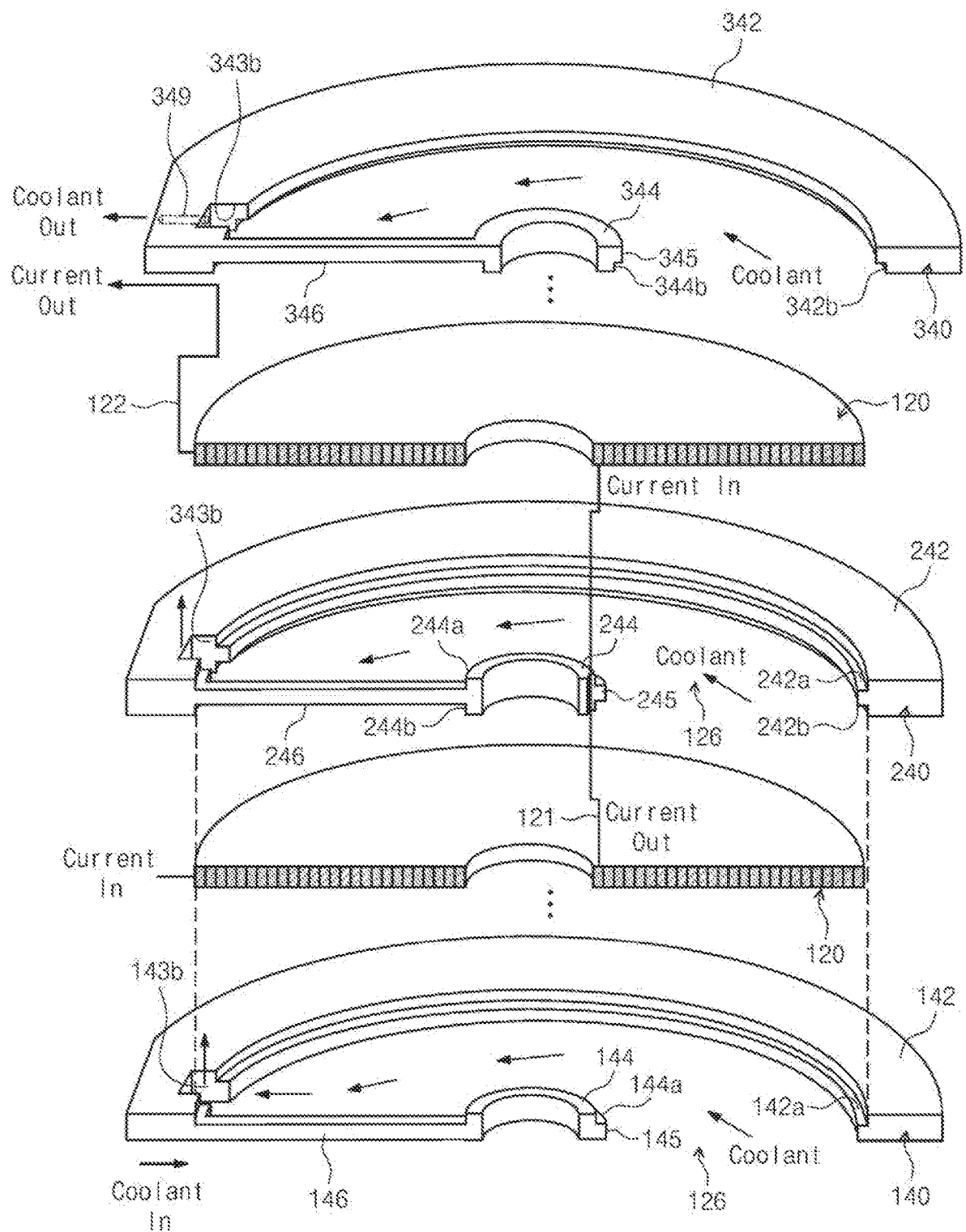
FIG. 7 is a cutaway perspective view of a spacer and a pancake coil of the electromagnet in FIG. 1.

FIG. 7 is a cutaway perspective view of a spacer and a pancake coil of the electromagnet in FIG. 1.

Figure 8:
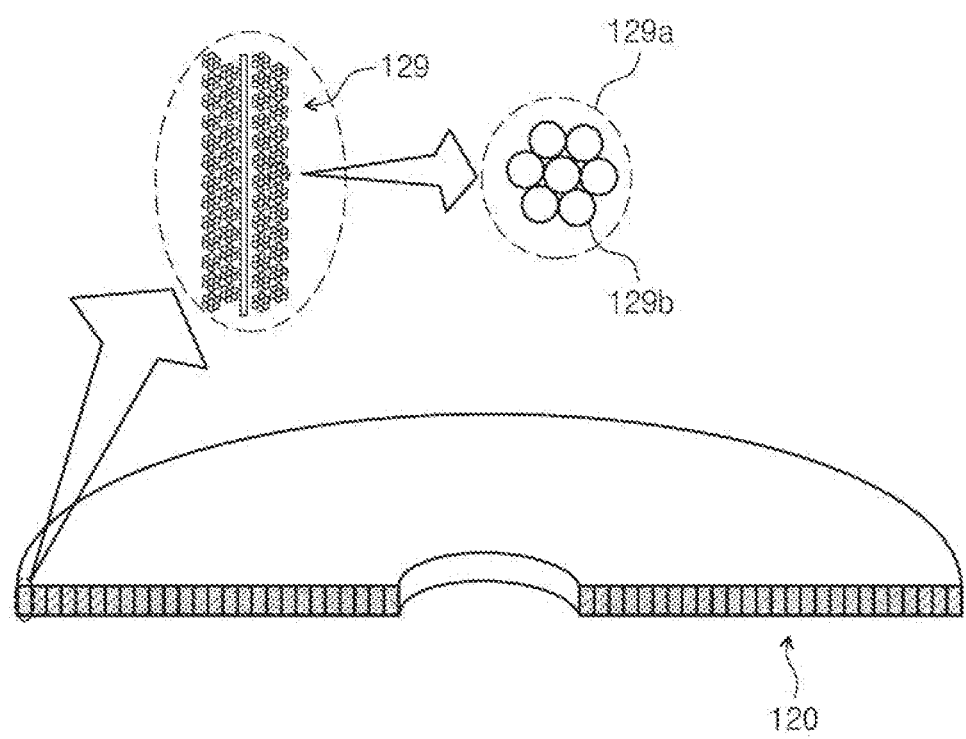
FIG. 8 is a cutaway perspective view of a pancake coil of the electromagnet in FIG. 1.

FIG. 8 is a cutaway perspective view of a pancake coil of the electromagnet in FIG. 1.

Figure 9:
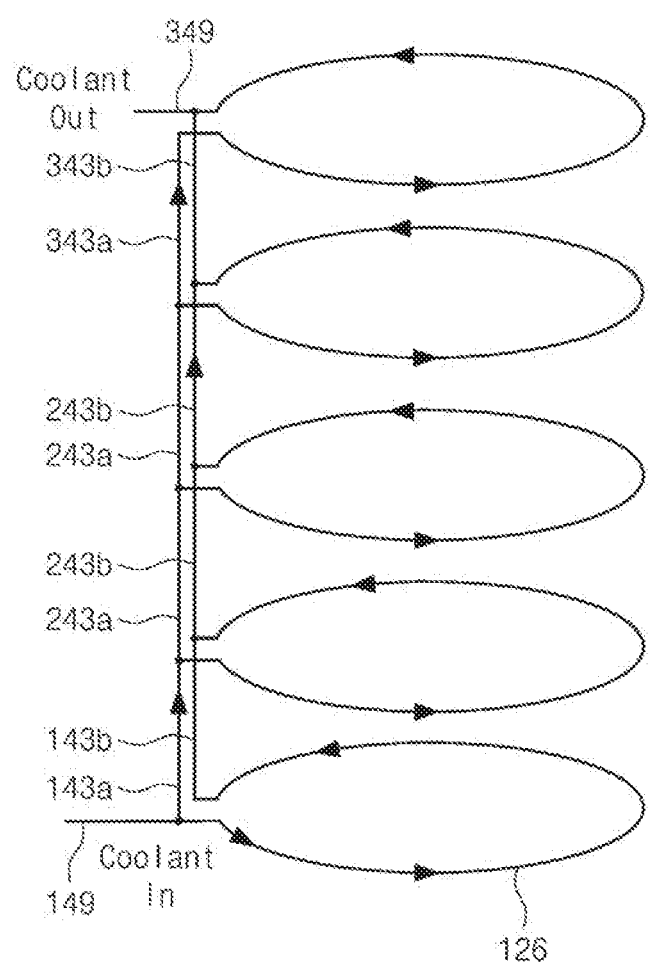
FIG. 9 is a conceptual diagram illustrating a coolant flow of the electromagnet in FIG. 1.

FIG. 9 is a conceptual diagram illustrating a coolant flow of the electromagnet in FIG. 1.

Figure 10:
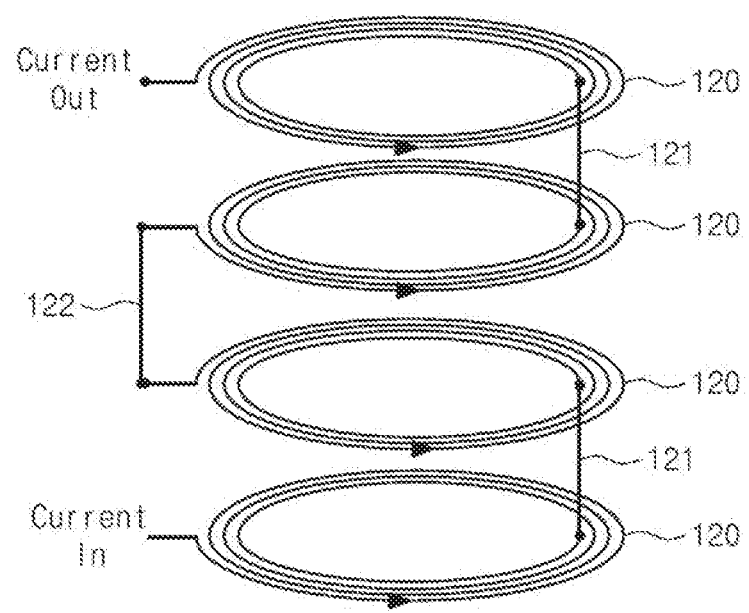
FIG. 10 is a conceptual diagram illustrating an electrical connection relationship between pancake coils of the electromagnet in FIG. 1.

FIG. 10 is a conceptual diagram illustrating an electrical connection relationship between pancake coils of the electromagnet in FIG. 1.

Figure 11:
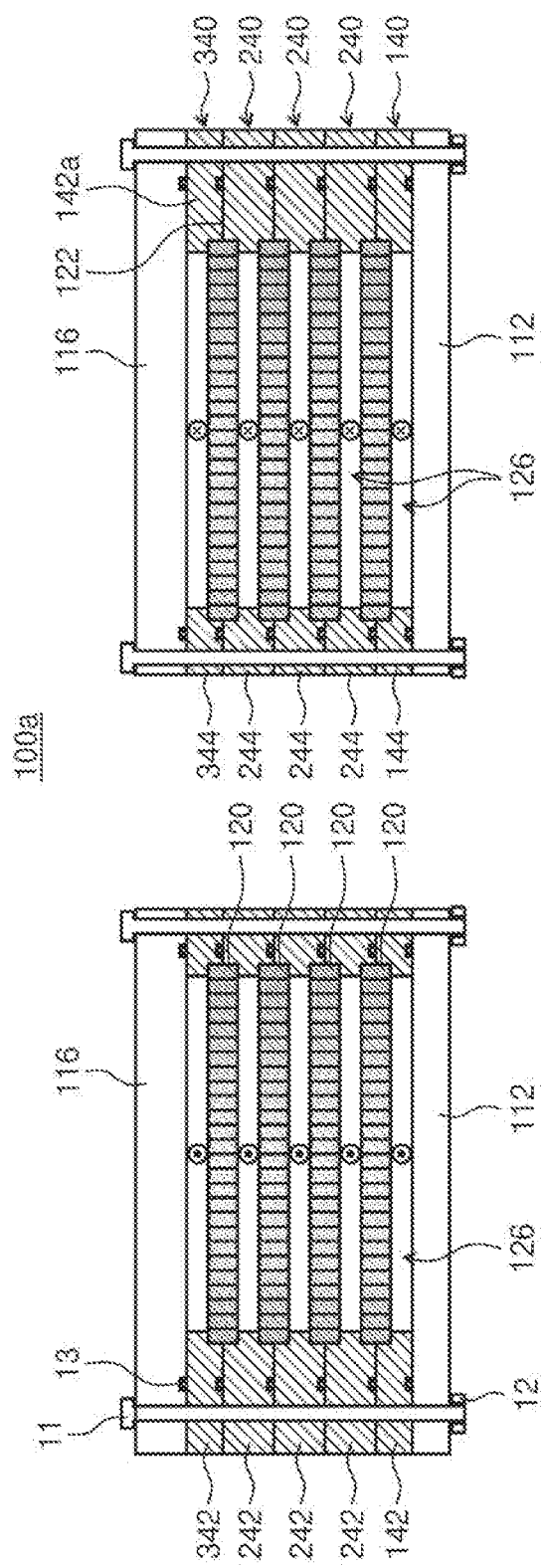
FIG. 11 is a cross-sectional view of an electromagnet according to another example embodiment of the present disclosure.

FIG. 11 is a cross-sectional view of an electromagnet according to another example embodiment of the present disclosure.

Referring to FIGS. 1 to 10, a fluid-cooled electromagnet 100 includes an upper housing 116, a lower housing 112 vertically aligned with the upper housing 116, a plurality of pancake coils 120 disposed between the upper housing 116 and the lower housing 112 to be spaced apart from each other and sequentially stacked to have a washer shape, and at least one spacer 240, disposed between the upper housing 116 and the lower housing 112, accommodating the pancake coils 120 at regular intervals.

The spacer 240 includes a washer-shaped external side spacer 242 having a first upper groove 242a to receive a portion of an external side surface of one pancake coil 120 and a first lower groove 242b to receive a portion of an external side surface of another pancake coil 120, an internal side spacer 244 having a second upper groove 244a to receive a portion of an internal side surface of one pancake coil 120 and a second lower groove 244b to receive a portion of an internal side surface of another pancake coil 120, and a fluid path blocking portion 246 connecting the internal side spacer 244 and the external side spacer 242 in a radial direction and blocking washer-shaped coolant flowing spaces 126, respectively formed above and below the pancake coil 120. The external side spacer 242 includes a first vertical coolant flowing space 243a and a second vertical coolant flowing space 243b, recessed on an internal side surface of the external side spacer 242, disposed to penetrate through the external side spacer 242, and respectively disposed in both sides of a connection portion of the flow path blocking portion 246.

A coolant is introduced through the first vertical coolant flowing space 243a and is discharged through the second vertical coolant flowing space 243b after rotating once along the coolant flowing space 126.

The upper housing 116 is disposed above an uppermost surface of the pancake coils 120. A coolant is provided between the upper housing 116 and the pancake coil 120. The coolant may directly cool the pancake coil 120. The upper housing 116 may have a washer shape and may include a nonmagnetic insulating material. Specifically, the upper housing 116 may include a plastic material as an insulating material.

The lower housing 112 is disposed below a lowermost surface of the pancake coils 120. A coolant is provided between the lower housing 112 and the pancake coil 120. The coolant may cool the pancake coil 120. The lower housing 112 may have a washer shape and may include a nonmagnetic insulating material. Specifically, the lower housing 112 may include a plastic material as an insulating material. The upper housing 116 and the lower housing 112 may have the same shape and may be vertically aligned with each other.

The pancake coils 120 are spaced apart from each other by the spacers 240, respectively. The pancake coil 120 may include a Litz wire 129 wound in a spiral form, and the Litz wire 129 may be molded by an adhesive filling material. The adhesive filling material may be epoxy, thermally conductive epoxy, a polyurethane adhesive, or a reactive acrylic adhesive. Accordingly, the pancake coil 120 may be in the form of a washer shape having a constant thickness.

The pancake coils 120 may be sequentially connected to each other in series depending on a layer height. The number of the pancake coils 120 may be even or odd. The pancake coils 120 are alternately wound in opposite directions depending on the layer height. The Litz wire 129, constituting the pancake nose 120, may have a rectangular cross section. Each of the pancake coils 120 may be molded by an adhesive filling material. The adhesive filling material may be epoxy, thermally conductive epoxy, a polyurethane adhesive, or a reactive acrylic adhesive. The Litz wire, constituting the pancake coil 120, may be fixed by the adhesive while being wound. The pancake coils 120 may be fixed to the spacers 240.

The pancake coils 120 may be vertically aligned with each other and arranged at regular intervals, and may have the same structure. The pancake coils 120 are connected to each other in series to generate a magnetic field in the same direction. In addition, the pancake coils 120 are alternately wound in a spiral form in opposite directions. Accordingly, the connection portions of adjacent pancake coils 120 are aligned in locations perpendicular to each other and current, flowing to the pancake coils 120, generally flows in the same azimuth direction.

The number of windings of each of the pancake coils 120 may be about 75 on the same plane. The Litz wire, constituting the pancake coil 120, may have a rectangular cross section. The Litz wire 129 may include nine lower bundles and eight supper bundles disposed on the lower bundles. Each bundle 129a may include seven copper lead wires 129b coated with an insulating material.

The pancake coils 120, adjacent to each other, include an internal side connection portion 121 and an external side connection portion 122 for electrical connection. The pancake coils 120, adjacent to each other, may be connected through the internal side connection portion 122, formed of a Litz wire perpendicular to a disposition plane, around an external radius thereof. The pancake coils 120, adjacent to each other, may be connected through the internal side connection portion 121, formed of a Litz wire perpendicular to the disposition plane, around an internal radius thereof. The internal side connection portion 121 or the external side connection portion 122 may be connected through silver-solder welding.

The pancake coils 120 may be sequentially connected to each other in series depending on a layer height, the number of the pancake coils 120 may be even, and the pancake coils 120 may be alternately wound in opposite directions depending on the layer height.

The spacer 240 may include an external side spacer 242 having a washer shape, an internal side spacer 244 having a washer state, and a flow path blocking portion 246 connecting the external side spacer and the internal side spacer in a radial direction. The spacer 240 may include a plastic material as an insulating material. The external spacer 242 may have a washer shape. A first upper groove 242a of the external spacer 242 may be recessed in a staircase shape above an internal circumferential surface thereof. An external circumferential surface of a washer-shaped pancake coil may be inserted into the first upper groove 242a to be aligned therewith. A first lower groove 242b of the external spacer 242 may be recessed in a staircase shape below an internal circumferential surface thereof. A thickness of the external side spacer 242 may be decreased in upper and lower portions of an internal circumferential surface. A depth of the first upper groove 242a or a depth of the first lower groove 242b may be half the thickness of the pancake coil 120. The external side spacer 242 may have a protrusion such that the pancake coils are inserted into the internal side upper and lower surfaces, respectively.

A first vertical coolant flowing space 243a and a second vertical coolant flowing space 243b are recessed in an internal side surface of the external side spacer 242 in a radial direction and penetrate through the external side spacer 242. The first vertical coolant flowing space 243a and the second vertical coolant flowing space 243b are disposed on opposite sides of the connection portion of the flow path blocking portion 246, respectively. The first vertical coolant flow space 243a may provide a coolant to the coolant flowing space 243, and the second vertical coolant flow space 243b may discharge the coolant rotating the coolant flow space 243 once. The external side connection portion 122, electrically connecting adjacent pancake coils to each other, may be wired through the first vertical coolant flowing space 243a or the second vertical coolant flowing space 243b.

The internal side spacer 244 may have a washer shape, and may be recessed above the external circumferential surface thereof in a staircase shape to provide a second upper groove 244a. The internal side spacers 244 may be recessed below the external circumferential surface in a staircase shape to provide the second lower groove 244b. The external circumferential surface of the pancake coil may be inserted into and aligned with the first upper groove 242a, and the internal circumferential surface of the pancake coil may be inserted into the second upper groove 244a to be aligned therewith. An internal diameter of the first upper groove 242a may be the same as an external diameter of the pancake coil. In addition, an external diameter of the second upper groove 244a may be the same as an internal diameter of the pancake coil. The internal side spacer 244 may have a protrusion such that the pancake coils are inserted into the external side upper and lower surfaces, respectively.

The internal side spacer 244 may be locally recessed on the external side surface of the internal side spacer and may penetrate through the internal side spacer, and may include a vertical wiring connection space 245. The vertical wiring connection space 245 may be disposed on a side opposing a side rotating 180 degrees in the flow path blocking portion 246. The internal side connection portion 121, electrically connecting adjacent pancake coils to each other, may be wired through the vertical wire connection space 245.

The flow path blocking portion 246 may have a rectangular pillar shape, and may connect the internal side spacers 244 and the external side spacers to each other in a radial direction. The flow path blocking portion 246 may have a thickness equal to a distance between adjacent pancake coils. Accordingly, the space between adjacent pancake coils forms a coolant flowing space, and the coolant flowing space may be blocked by the flow path blocking portion 246. As a result, the coolant introduced into the coolant flowing space may be discharged after rotating once along the coolant flowing space in an azimuthal direction.

The coolant flows along the coolant flowing space 126, and the coolant flowing space 126 may be a space which is not filled with pancake coils spaced apart from each other by a spacer. The coolant may directly cool the upper and lower surfaces of the pancake coil to improve cooling efficiency.

When current flows to the pancake coil 120, heat generated by Joule heating may be directly transferred to the coolant. The coolant may be forcibly circulated through a pump, and the heat of the coolant, getting out of an electromagnet, may be removed through a heat exchanger disposed in outside thereof. The coolant may be maintained at a constant temperature. The coolant may be water, mineral oil, silicone oil, or a fluorine compound.

The upper spacer 340 may be disposed between the spacer 240 and the upper housing 116. The lower spacer 140 may be disposed between the spacer 240 and the lower housing 112. The upper spacer 340 may have a structure in which the upper groove is removed by cutting the upper spacer 340 along a disposition plane in the spacer 240. That is, the upper spacer 340 may receive the pancake coil only on a lower surface thereof. In addition, the lower spacer 140 may have a structure in which the lower groove is removed by cutting the lower spacer 140 along the disposition plane in the spacer 240. The lower spacer 140 may receive the pancake coil 120 only on an upper surface thereof.

The upper spacer 340 includes a washer-shaped external side upper spacer 342 having a first lower groove 342b to receive a portion of an external side surface of the pancake coil 120, an internal side upper spacer 344 having a second lower groove 344b to receive a portion of an internal side surface of the pancake coil, and a flow path blocking portion 346 connecting the internal side upper spacer 344 and the external side upper spacer 342 in a radial direction and blocking washer-shaped coolant flowing spaces formed in upper and lower portions of the pancake coil. The external side upper spacer 342. The external side spacer 342 includes a first vertical coolant flowing space 343a and a second vertical coolant flowing space 343b recessed on an internal side surface of the external side upper spacer, disposed to penetrate through the external side upper spacer, and respectively disposed on opposite sides of a connection portion of the flow path blocking portion 346.

The upper housing 116, the upper spacer 340, the spacer 240, the lower spacer 140, and the lower housing 112 may be molded by an adhesive to be integrated while being coupled to each other.

A coolant inlet 149 may be formed on a side surface of the external side lower spacer 142 and may be connected to the first vertical coolant flowing space 143a. A coolant outlet 349 may be formed on a side surface of the external side upper spacer 342 and may be connected to the second vertical coolant flowing space 343b.

FIG. 11 is a cross-sectional view of an electromagnet according to another example embodiment of the present disclosure.

Referring to FIG. 11, a fluid-cooled electromagnet 100a includes an upper housing 116, a lower housing 112 vertically aligned with the upper housing 116, a plurality of pancake coils 120 disposed between the upper housing 116 and the lower housing 112 to be spaced apart from each other and sequentially stacked to have a washer shape, and at least one spacer 240 disposed between the upper housing 116 and the lower housing 112 to receive the pancake coils 120 at regular intervals.

The spacer 240 includes a washer-shaped external side spacer 242 having a first upper groove 242a to receive a portion of an external side surface of one pancake coil 120 and a first lower groove 242b to receive a portion of an external side surface of another pancake coil 120, an internal side spacer 244 having a second upper groove 244a to receive a portion of an internal side surface of one pancake coil 120 and a second lower groove 244b to receive a portion of an internal side surface of another pancake coil 120, and a fluid path blocking portion 246 connecting the internal side spacer 244 and the external side spacer 242 in a radial direction and blocking washer-shaped coolant flowing spaces 126, respectively formed above and below the pancake coil 120. The external side spacer 242 includes a first vertical coolant flowing space 243a and a second vertical coolant flowing space 243b, recessed on an internal side surface of the external side spacer 242, disposed to penetrate through the external side spacer 242, and respectively disposed in both sides of a connection portion of the flow path blocking portion 246.

The lower housing 112, the spacers 240, and the upper housing 116 may be fixed to each other by a bolt 11 and a nut 12 and may be sealed by an O-ring 13 to seal a coolant. The bolt 11 may be disposed to penetrate through the lower housing 116, the upper spacer 340, the spacers 240, the lower spacer 240, and the upper housing 140. Bolts 11 may be arranged inside and outside the lower housing 116 at regular intervals. The bolt 11 and the nut 12 may be formed of a nonmagnetic material.

As described above, an electromagnet according to an example embodiment may be provided with a coolant flowing space, formed in upper and lower surfaces of a pancake coil, through which a coolant flows. Thus, a temperature of heat, generated in the pancake coil, may be effectively decreased and thermal noise may be removed using a Litz wire.

An electromagnet according to an example embodiment may generate a pre-polarization magnetic field without time limitation while constantly maintaining an internal temperature of a coil in such a manner that a coolant (water, mineral oil, silicone oil, a fluorine compound, or the like) is circulated at a constant rate while being maintained at a constant temperature using an external pump and a heat exchanger.

Although the present disclosure and its advantages have been described in detail, it should be understood that various changes, substitutions and alterations can be made herein without departing from the spirit and scope of the disclosure as defined by the following claims.

What is claimed is:

1. A fluid-cooled electromagnet comprising:
   an upper housing;
   a lower housing vertically aligned with the upper housing;
   a plurality of pancake coils disposed between the upper housing and the lower housing to be spaced apart from each other and sequentially stacked to have a washer shape; and
   at least one spacer, disposed between the upper housing and the lower housing, accommodating the pancake coils at regular intervals,
   wherein the spacer comprises:
   a washer-shaped external side spacer having a first upper groove to receive a portion of an external side surface of one pancake coil and a first lower groove to receive a portion of an external side surface of another pancake coil;
   an internal side spacer having a second upper groove to receive a portion of an internal side surface of one pancake coil and a second lower groove to receive a portion of an internal side surface of another pancake coil; and
   a fluid path blocking portion connecting the internal side spacer and the external side spacer in a radial direction and blocking washer-shaped coolant flowing spaces, respectively formed above and below the pancake coil,
   wherein the external side spacer comprises a first vertical coolant flowing space and a second vertical coolant flowing space, recessed on an internal side surface of the external side spacer, disposed to penetrate through the external side spacer, and respectively disposed in both sides of a connection portion of the flow path blocking portion, and
   wherein a coolant is introduced through the first vertical coolant flowing space and is discharged through the second vertical coolant flowing space after rotating once along the coolant flowing space.

2. The fluid-cooled electromagnet as set forth in claim 1, wherein the lower housing, the spacers, and the upper housing are fixed to each other by an adhesive to be integrated.

3. The fluid-cooled electromagnet as set forth in claim 1, wherein the pancake coil includes a Litz wire wound in a spiral form, and the Litz wire is molded by an adhesive filling material.

4. The fluid-cooled electromagnet as set forth in claim 1, wherein the internal side spacer is recessed on an external side surface of the internal side spacer, penetrates through the internal side spacer, and includes a vertical wiring connection space.

5. The fluid-cooled electromagnet as set forth in claim 1, further comprising:
   an upper spacer disposed between the spacer and the upper housing; and
   a lower housing disposed between the spacer and the lower housing,
   wherein the upper spacer comprises:
   a washer-shaped external side upper spacer having a first lower groove to receive a portion of an external side surface of the pancake coil;
   an internal side upper spacer having a second lower groove to receive a portion of an internal side surface of the pancake coil; and
   a flow path blocking portion connecting the internal side upper spacer and the external side upper spacer in a radial direction and blocking washer-shaped coolant flowing spaces, respectively formed above and below the pancake coil,
   wherein the external side upper spacer includes a first vertical coolant flowing space and a second vertical coolant flowing space recessed on an internal side surface of the external side upper spacer, disposed to penetrate through the external side upper spacer, and respectively disposed in both sides of a connection portion of the flow path blocking portion,
   wherein the lower spacer comprises:
   a washer-shaped external side lower spacer having a first upper groove to receive a portion of an external side surface of the pancake coil;
   an internal side lower spacer having a second upper groove to receive a portion of an internal side surface of the pancake coil; and
   a flow path blocking portion connecting the internal side lower spacer and the external side lower spacer in a radial direction and blocking washer-shaped coolant flowing spaces, respectively above and below the pancake coil, and
   wherein the external side lower spacer includes a first vertical coolant flowing space and a second vertical coolant flowing space recessed on an internal side surface of the external side lower spacer, disposed to penetrate through the external side lower spacer, and respectively disposed in both sides of a connection portion of the flow path blocking portion.

6. The fluid-cooled electromagnet as set forth in claim 5, further comprising:
   a coolant inlet penetrating through a side surface of the external side lower spacer to be connected to the first vertical coolant flowing space; and
   a coolant outlet penetrating through a side surface of the external side upper spacer to be connected to the second vertical coolant flowing space.

7. The fluid-cooled electromagnet as set forth in claim 1, wherein each of the pancake cools is wound on the same plane in a spiral form, and
   the pancake coils are electrically connected to each other in series.

8. The fluid-cooled electromagnet as set forth in claim 1, wherein the lower housing, the spacers, and the upper housing are fixed to each other by a bolt and a nut to be sealed through an O-ring.

\* \* \* \* \*